United States Patent
Chou et al.

(10) Patent No.: US 7,424,907 B2
(45) Date of Patent: Sep. 16, 2008

(54) METHODS AND APPARATUS FOR AN INTEGRATED FAN PUMP COOLING MODULE

(75) Inventors: Der Jeou Chou, Mesa, AZ (US); Daniel Todd Nelson, Cave Creek, AZ (US)

(73) Assignee: Enertron, Inc., Tempe, AZ (US)

( * ) Notice: Subject to any disclaimer, the term of this patent is extended or adjusted under 35 U.S.C. 154(b) by 873 days.

(21) Appl. No.: 10/611,484

(22) Filed: Jul. 1, 2003

(65) Prior Publication Data

US 2006/0169440 A1  Aug. 3, 2006

Related U.S. Application Data

(60) Provisional application No. 60/415,057, filed on Oct. 1, 2002.

(51) Int. Cl.
*H05K 7/20* (2006.01)
(52) U.S. Cl. ................. 165/80.4; 165/104.33; 165/121; 361/699
(58) Field of Classification Search ................. 165/80.4, 165/104.31, 104.33; 361/697, 699
See application file for complete search history.

(56) References Cited

U.S. PATENT DOCUMENTS

| | | | | |
|---|---|---|---|---|
| 3,860,064 A | * | 1/1975 | Murphy | 165/121 |
| 3,989,102 A | * | 11/1976 | Jaster et al. | 165/104.31 |
| 5,121,788 A | * | 6/1992 | Carollo | 165/47 |
| 5,309,319 A | * | 5/1994 | Messina | 361/699 |
| 6,019,165 A | * | 2/2000 | Batchelder | 165/80.3 |
| 6,208,512 B1 | * | 3/2001 | Goldowsky et al. | 361/699 |
| 6,327,145 B1 | * | 12/2001 | Lian et al. | 361/697 |
| 6,587,343 B2 | * | 7/2003 | Novotny et al. | 361/698 |
| 6,600,649 B1 | * | 7/2003 | Tsai et al. | 361/697 |
| 6,668,911 B2 | * | 12/2003 | Bingler | 165/80.4 |
| 2002/0162647 A1 | * | 11/2002 | Wagner | 165/121 |
| 2002/0185263 A1 | * | 12/2002 | Wagner et al. | 165/104.33 |
| 2003/0209343 A1 | * | 11/2003 | Bingler | 165/80.4 |

\* cited by examiner

*Primary Examiner*—Allen J Flanigan
(74) *Attorney, Agent, or Firm*—Robert D. Atkins; Quarles & Brady LLP

(57) ABSTRACT

An integrated fan pump includes a fan, a pump, and an electrical drive mechanism such as an electric motor configured to simultaneously drive both the fan and pump with respect to the housing. A heat exchanger is preferably connected to the pump and the component to be cooled. In one embodiment, the fan head and the pump head are fixed to a common axle, a single magnet is fixed to the fan head, and the magnetic coil is fixed to the housing. In another embodiment, the fan head and pump head rotate about a fixed axle, the magnetic coil is fixed to said housing, one magnet is fixed to the fan head, and a second magnet is fixed to the pump head.

5 Claims, 10 Drawing Sheets

METHODS AND APPARATUS FOR AN INTEGRATED FAN PUMP COOLING MODULE

CROSS-REFERENCE TO RELATED APPLICATIONS

This application claims priority from U.S. Provisional Patent Application Ser. No. 60/415,057, filed Oct. 1, 2002.

BACKGROUND OF THE INVENTION

1. Technical Field

The present invention generally relates to cooling systems and, more particularly, to a cooling module that provides fan/pump integration.

2. Background Information

Recent advances in computer technology have been largely driven by the increasing speed and decreasing size of semiconductor devices and other electronic components, a trend famously predicted by Moore's law, which states that the performance of semiconductor devices generally doubles every eighteen months.

This reduction in size and increase in speed gives rise to a number of challenges, not the least of which is the challenge of cooling semiconductor devices and other such heat-generating components during operation. For example, it is predicted that, in the near future, it will not be unusual for CPUs to generate on the order of 100 watts or more. The traditional cooling systems for such devices—i.e., heat sinks, fan coolers, and the like—will no longer be capable of dissipating this level of heat, particularly in systems (such as personal computer systems) where the components are held within a relatively small, densely packed, and poorly ventilated enclosure.

Furthermore, while small coolant pumps have been developed for liquid cooling of components and other heat-generating devices, such pumps are typically expensive, overpowered, consume too much power, and require additional space inside the enclosure.

Advanced cooling systems are therefore needed to overcome these and other limitations of the prior art.

SUMMARY OF THE INVENTION

The present invention provides a compact, efficient cooling apparatus comprising a fan, a pump, and an electrical drive mechanism (e.g., an electric motor) configured to simultaneously drive both the fan and the pump.

In accordance with one embodiment of the present invention, a heat exchanger is coupled (i.e., via a suitable tubing arrangement) to the pump and the heat-generating device (or "heat source") to be cooled.

In accordance with a further embodiment of the present invention, the pump is configured such that gas flow (e.g., air flow) through the fan is substantially unimpeded by the pump.

In accordance with another embodiment of the present invention, an expansion tank is coupled to the pump.

In accordance with another embodiment of the present invention, the fan head and the pump head are fixed to a common axle, a single magnet is fixed to the fan head, and one or more magnetic coils are fixed to the housing.

In accordance with another embodiment of the present invention, the fan head and the pump head rotate about a fixed axle, the magnetic coil is fixed to the housing, one magnet is fixed to the fan head, and a second magnet is fixed to the pump head.

In accordance with one embodiment of the present invention, the axle is a single contiguous longitudinal member; in an alternate embodiment, however, the axle includes a first axle segment coupled to the fan head and a second axle segment coupled to the pump head, wherein the first and second axle segments are coupled via a gearing mechanism, a speed adjustment mechanism, or any other such mechanical coupling.

BRIEF DESCRIPTION OF THE DRAWINGS

The subject invention will hereinafter be described in conjunction with the appended drawing figures, wherein like numerals denote like elements, and.

DETAILED DESCRIPTION

The present invention provides a fan and pump integrated into an electrically controlled, compact module such that the pump and fan can be simultaneously driven by an electric motor, the various configurations of which are described in detail below.

Figure 1:
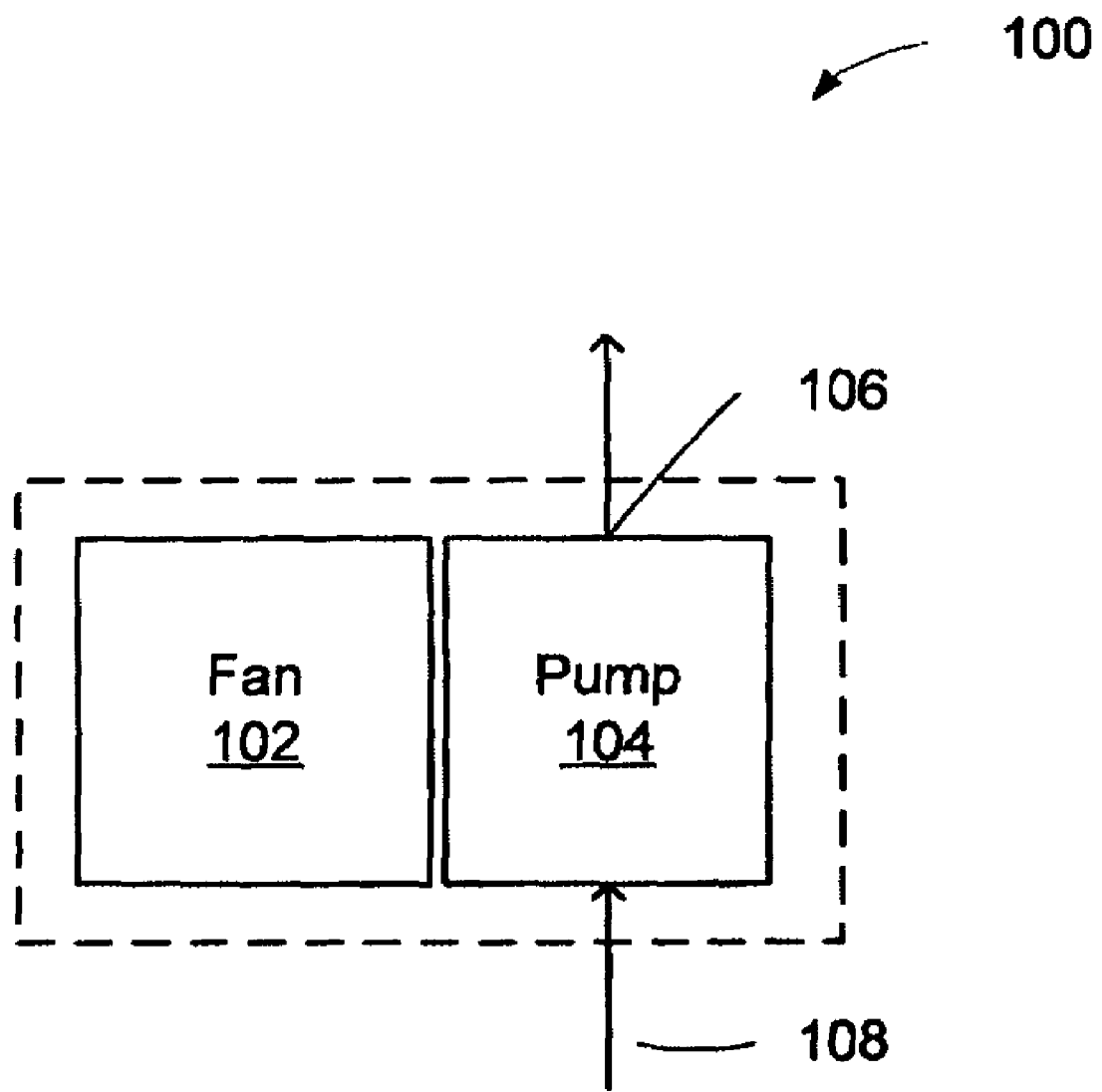
FIG. 1 is a schematic block diagram overview of an integrated fan pump in accordance with the present invention.

With reference to FIG. 1, fan pump module (or simply "module") 100 comprises a fan 102 and a pump 104 simultaneously controlled by a drive mechanism (not shown). Pump 104 typically includes an outlet 106 and an inlet 108. As described in detail below, fan 102 and pump 104 comprise various components that are mechanically and/or magnetically linked to achieve simultaneous operation.

Figure 2A:
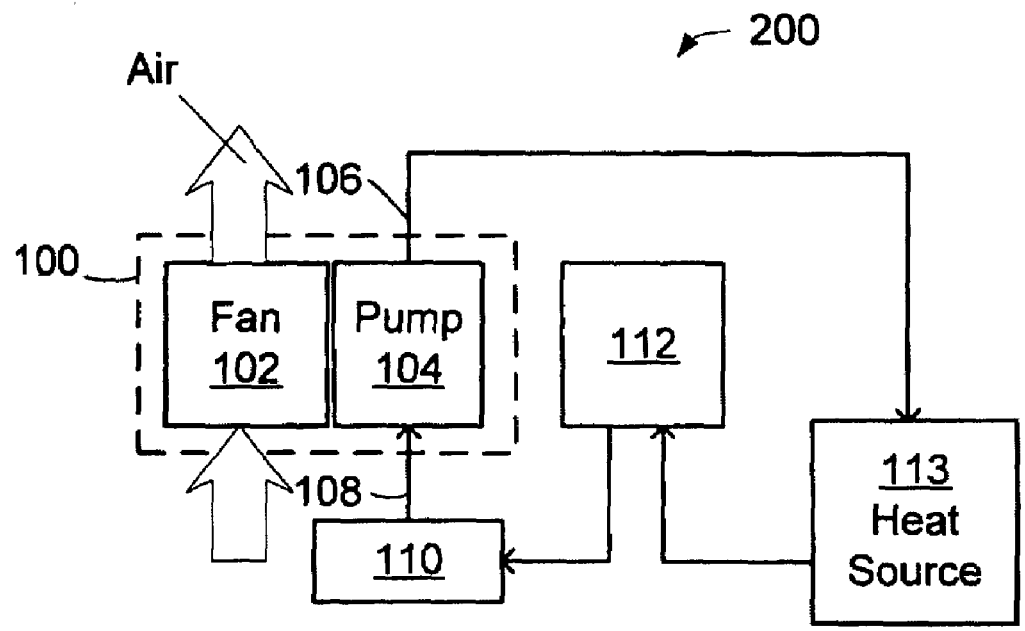
FIGS. 2A and 2B are schematic block diagrams depicting two context in which the present invention may be implemented.
Figure 2B:
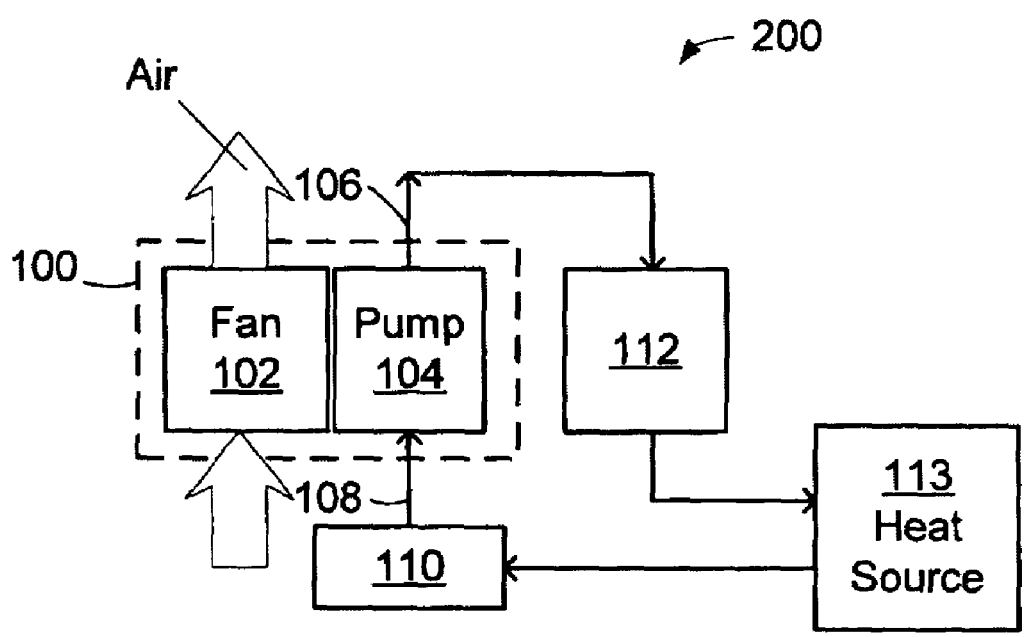

Module 100 may be integrated with other components in order to facilitate heat transfer to and from the heat source to be cooled. For example, as shown in FIGS. 2A and 2B, the system 200 may include a heat exchanger 112 and an expansion tank 110 suitably coupled to pump 104 via a variety of plumbing configurations, two of which are shown in FIGS.

2A and 2B. In this way, the coolant used by pump 104 may be transferred to the target heat source 113. A variety of "plumbing" components (e.g., tubes and the like) may be used to connect module 100 to external devices as described below in conjunction with FIGS. 4A and 4B.

Figure 3:
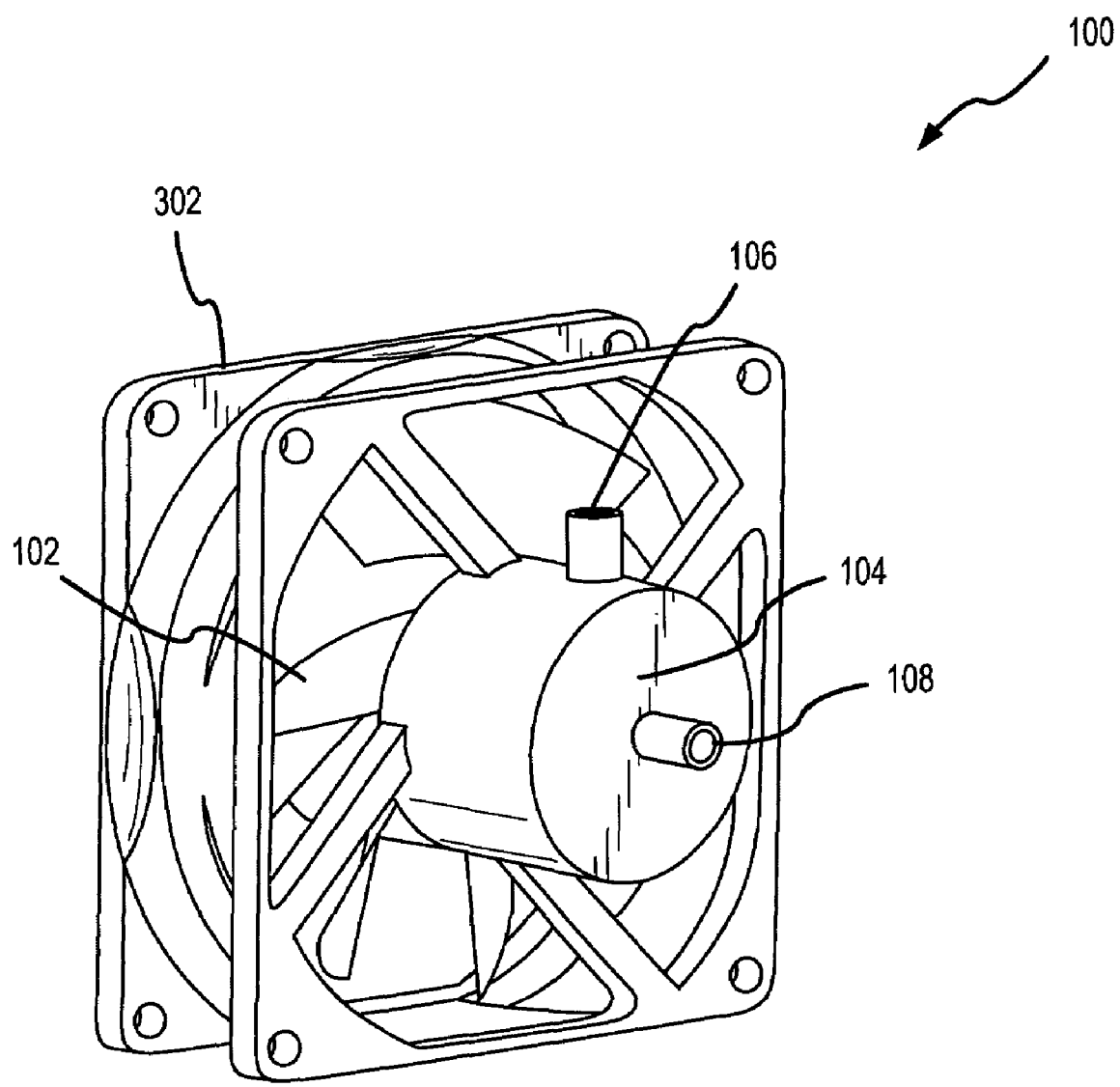
FIG. 3 is an exterior overview of an integrated fan pump in accordance with one embodiment of the present invention.

FIG. 3 shows an external view of one embodiment of the present invention. In this embodiment, a housing (in this case, a rectilinear housing) 302 supports, connects, or is otherwise coupled to pump 104 and fan 102, wherein pump 104 includes an outlet 106 and an inlet 108. Gas-flow through fan 102 is generally parallel to the fan's axis, and may blow either direction, depending upon the application. As fan 102 provides movement of the surrounding air (or other gas), pump 104 acts to move the coolant from inlet 108 to outlet 106.

The size of housing 302, pump 104, and fan 102 may be selected in accordance with the particular application in which it will be placed. For example, common axial fan sizes include 20×20 mm, 25×25 mm, 30×30 mm, 35×35 mm, 40×40 mm, 45×45 mm, 50×50 mm, 55×55 mm, 60×60 mm, 80×80 mm, 92×92 mm, 120×120 mm, 6" dia., 8" dia., 10" dia., and 12" dia. fans. The present invention is not limited to this list of fan sizes, however: any suitable custom fan size or shape might be used.

Figure 4A:
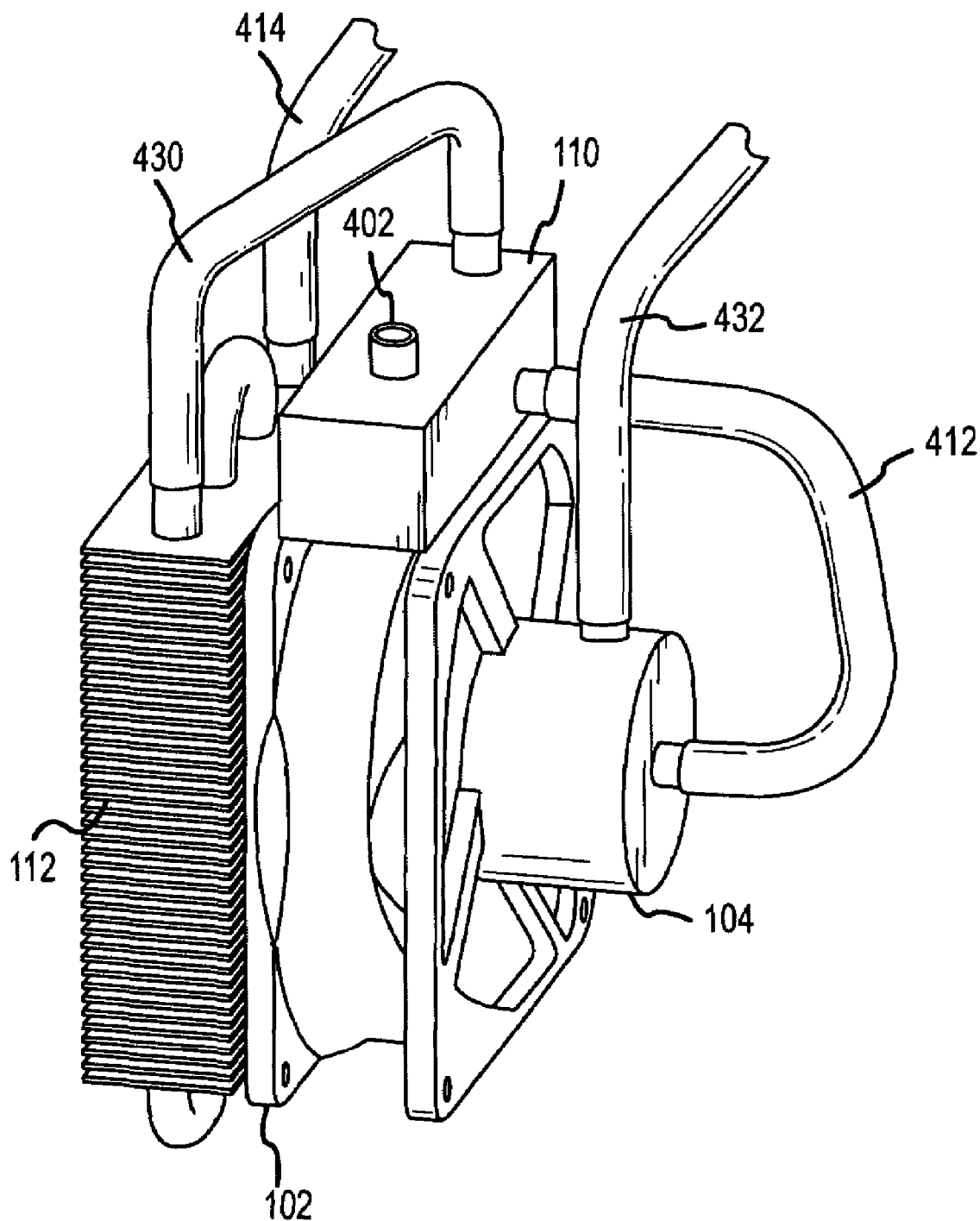
FIGS. 4A and 4B are exterior overviews of an integrated fan pump in accordance with the block diagrams shown in FIGS. 2A and 2B, respectively.
Figure 4B:
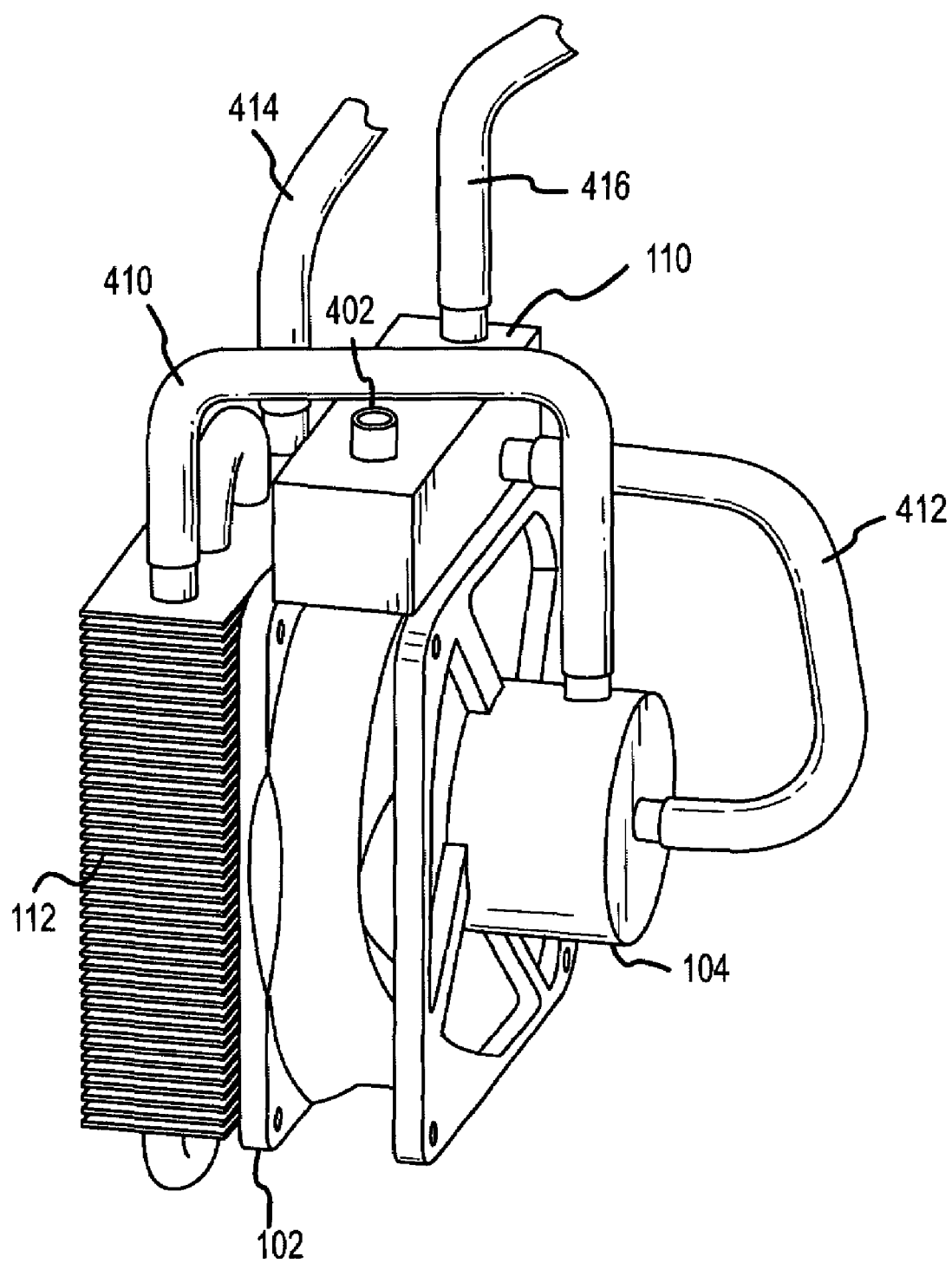

FIGS. 4A and 4B depict two configurations of the present invention used in conjunction with additional components as described briefly above. In the configuration shown in FIG. 4A, a heat exchanger 112 is positioned adjacent to fan 102 and is connected to an expansion tank 110 through a tube 430, while the heat source (not shown) is connected to the system via tubes 414 and 432. Heat exchanger 112 generally functions to reject heat from the coolant to the passing gas via heat conduction and forced convection. Various types of heat exchangers are discussed in further detail below.

Expansion tank 110 generally functions as a coolant fill port and reservoir. In the illustrated embodiment, a gas-release valve (or "air-release valve") 402 is incorporated in to expansion tank 110 to provide a method for balancing gas pressure inside the plumbing during the heating and cooling cycle. In a preferred embodiment, however, gas release valve 402 does not allow the release of the coolant. Expansion tank 110 may have any convenient shape and may be positioned in any convenient location with respect to pump 104. For example, expansion tank 110 may be remote from or integrated with housing 302 or pump 104.

In the alternate configuration shown in FIG. 4B, heat exchanger 112 is also positioned adjacent to fan 102 but is connected to pump 104 through a tube 410. Pump 104 is connected to expansion tank 110 via a tube 412, and the heat source (not shown) is thermally coupled to the system via tubes 414 and 416 as shown. That is tubes 416 and 414 (and tubes 414 and 432 shown in FIG. 4A) are configured to connect a coolant heat collector, or other such heat transfer device which is thermally coupled to the heat source to be cooled. Such a heat source may be located close to pump 104 or may be remote from pump 104 (e.g., at a remote location within a computer cabinet or other enclosed space). In addition to tubing, other components such as heat sinks, phase-change devices, heat pipes, and the like may also be incorporated into the cooling system to facilitate heat transfer. The nature of such coolant heat collector, or other such heat transfer device and the like are well known in the art, and will not be discussed in detail herein.

In accordance with a further embodiment of the present invention, the fan pump module is configured such that gas flow through the fan is substantially unimpeded by the pump. This is accomplished, for example, by making the external geometry of pump 104 sufficiently compact such that it does not substantially impede the flow of gas through fan 102. In the event that pump 104 is substantially cylindrical, as illustrated, it is advantageous to form pump 104 such that it's outer diameter is minimized and corresponds fairly closely to the base of the propellers of fan 102. Alternatively, pump 104 may be positioned entirely outside the gas flow region of fan 102 while remaining mechanically and/or magnetically linked to fan 102.

Figure 5:
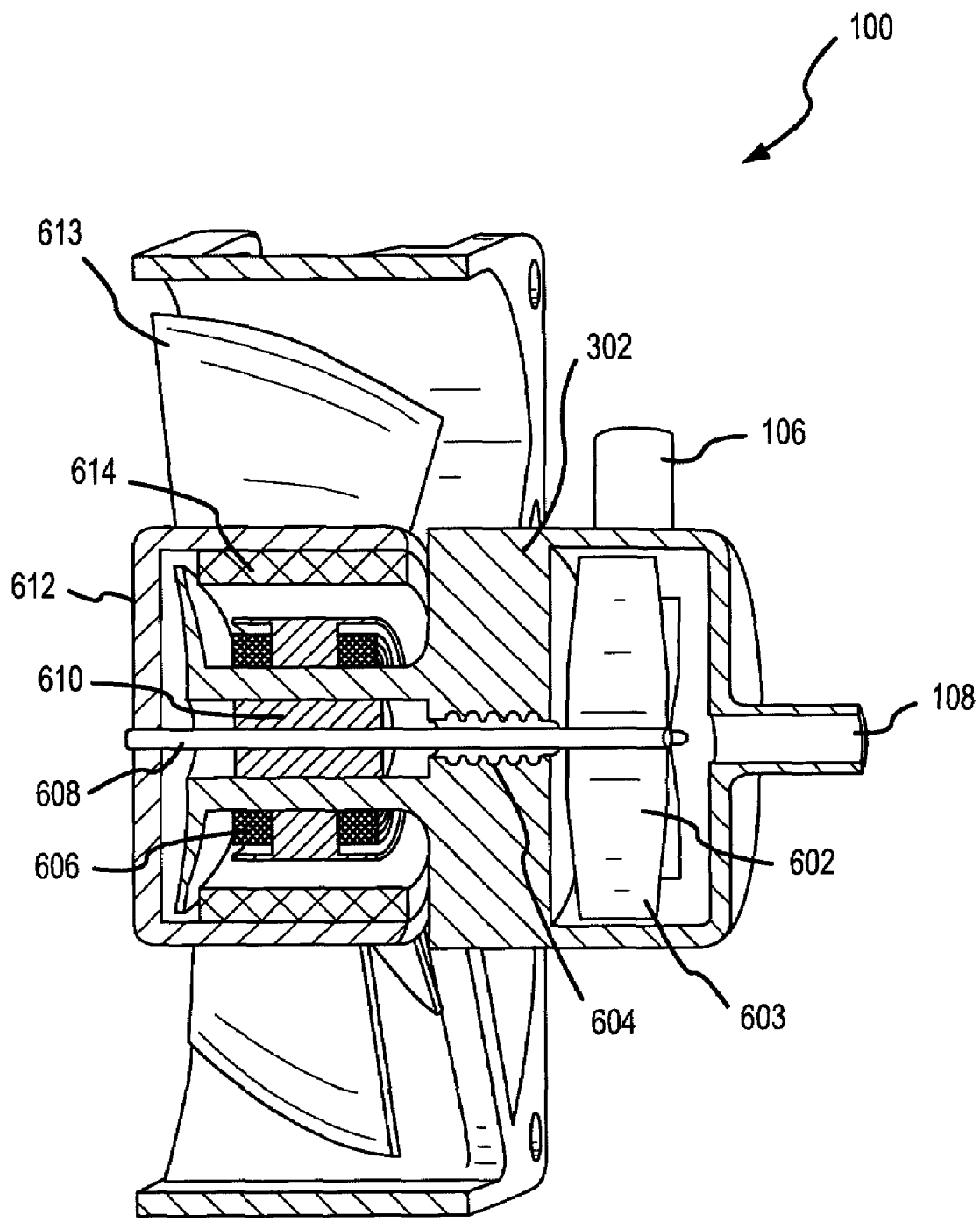
FIG. 5 is a cross-sectional view of an integrated fan pump in accordance with one embodiment of the present invention.

As mentioned briefly above, a system in accordance with one embodiment of the present invention is configured such that the fan head and the pump head are fixed to a common axle, a single magnet is fixed to the fan head, and a magnetic coil is fixed to the housing. That is, referring to the cross-section view shown in FIG. 5, one embodiment of the present invention comprises a pump head 602 coupled to pump impellers 603, a fan head 612 coupled to fan propellers 613, a magnet 614 connected to fan head 612, a bearing (e.g, a low-friction sleeve bearing) 610, a shared axle 608 (to which fan head 612 and pump head 602 are connected) a magnetic coil 606 fixed to housing 302, and a suitable liquid seal 604. The liquid seal is made of any suitable material, for example: nitrile rubber, Polyacrylate Rubber, Ethylene Propylene Rubber, Chloroprene Rubber, Fluoro-Rubber, Silicone Rubber, Butyl Rubber and other suitable rubber materials.

By applying the proper alternating electrical signal to magnetic coil 606, magnet 614 (which is coupled to fan head 612) induces rotation of both fan head 612 and (through axle 608) pump head 602. In this way, both fan head 612 and pump head 602 are actuated simultaneously, resulting in gas flow through the fan and liquid flow from inlet 108 to outlet 106.

Fan propeller 613 (as well as impeller 603) may have any number of blades and may have any suitable shape. For example, fan propeller 613 may be axial, tube-axial, centrifugal, crossflow, or backward-curved. In this regard, the embodiments illustrated herein are not intended to limit the scope of the invention. Any type of fan or fan blade now known or later developed may be used.

The components of the motor, pump, and fan may be selected to provide any suitable volume, flow rate, and rotational speed. For example, a fan pump module in accordance with one embodiment of the present invention has a rotational rate of approximately 2000 to 3000 rpm with a pump flow rate of 5 cc/sec to 10 cc/s. It will be appreciated, however, that these ranges are not intended to be limiting, and that any desired rotation rate and flow rate may be selected. The pump impeller may be axial blade, straight radial blade, acentrifugal blade, and backward-curved blade, forward-curved blade or turbine blade.

The motor used in the various module embodiments (implemented through the use of magnets and magnetic coils) is preferably of the DC brushless type. DC brushless motors are particularly advantageous as they traditionally have a long and reliable operational lifetime and are generally low cost. Nevertheless, any other convenient motor type may be used in connection with the present invention.

A variety of materials may be used for the components of this system, including various metals, plastics, ceramics, or a combination thereof In one embodiment, for example, various components are manufactured using Injection-moldable plastics, such as PP, ABS, PE, PBT, and the like.

Figures 6A, 6B:
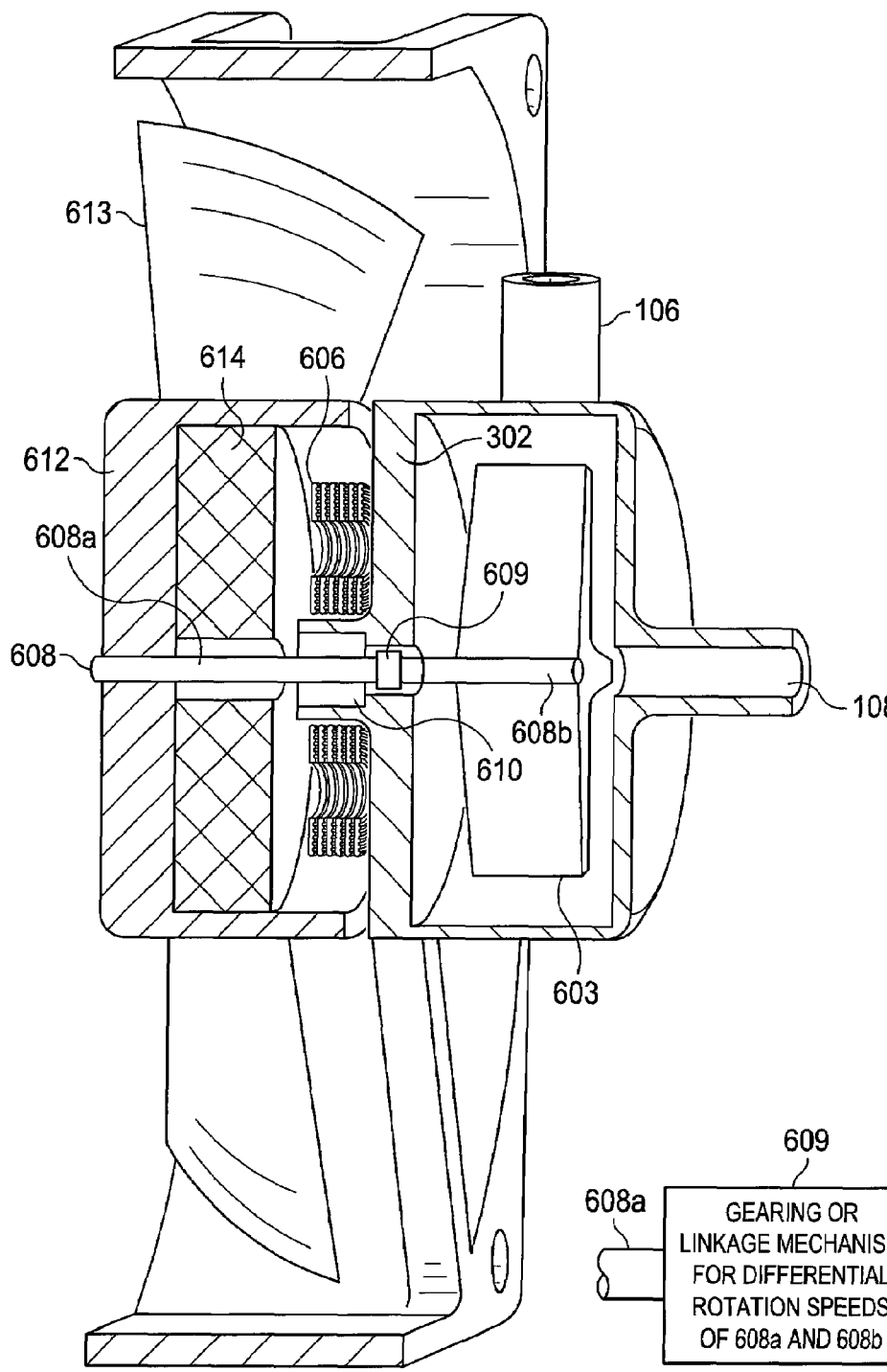
FIG. 6A is a cross-sectional view of an integrated fan pump in accordance with an alternate embodiment of the present invention.
FIG. 6B is a magnified view of the gearing mechanism of FIG. 6A.

In accordance with another embodiment of the present invention, shown in FIG. 6A, the ring-type magnet may be replaced by a disc magnet 614 which is fixed to the fan head, and the magnetic coil is replaced by a flat magnetic coil 606.

In accordance with another embodiment of the present invention, the fan head and pump head rotate about a fixed axle, the magnetic coil is fixed to said housing, and two magnets are used: one magnet fixed to the fan head, and a second magnet fixed to the pump head. That is, referring now to FIG. 7, magnet 614 is attached to fan head 612, and magnet 704 is attached to pump head 602. A fixed axle 608 is coupled to housing 302, and a bearing 702 is preferably included to provide free rotation around axle 608. Likewise, axle 608 may comprise two separate, collinear axles. Magnetic coil 606 is also fixed to housing 302. As a result, no fluid seal is required, as axle 608 does not rotate and is fixed to housing 302.

In this configuration, magnet 614 and magnet 704 are substantially coaxial toroidal magnets, and magnetic coil 606 is fixed therebetween. When suitable electrical signals are applied to magnetic coil 606 (e.g., AC or DC signals, depending upon motor selection), both magnets 614 and 704 are induced to rotate, causing simultaneous rotation of fan head 612 and pump head 704.

Figure 7:
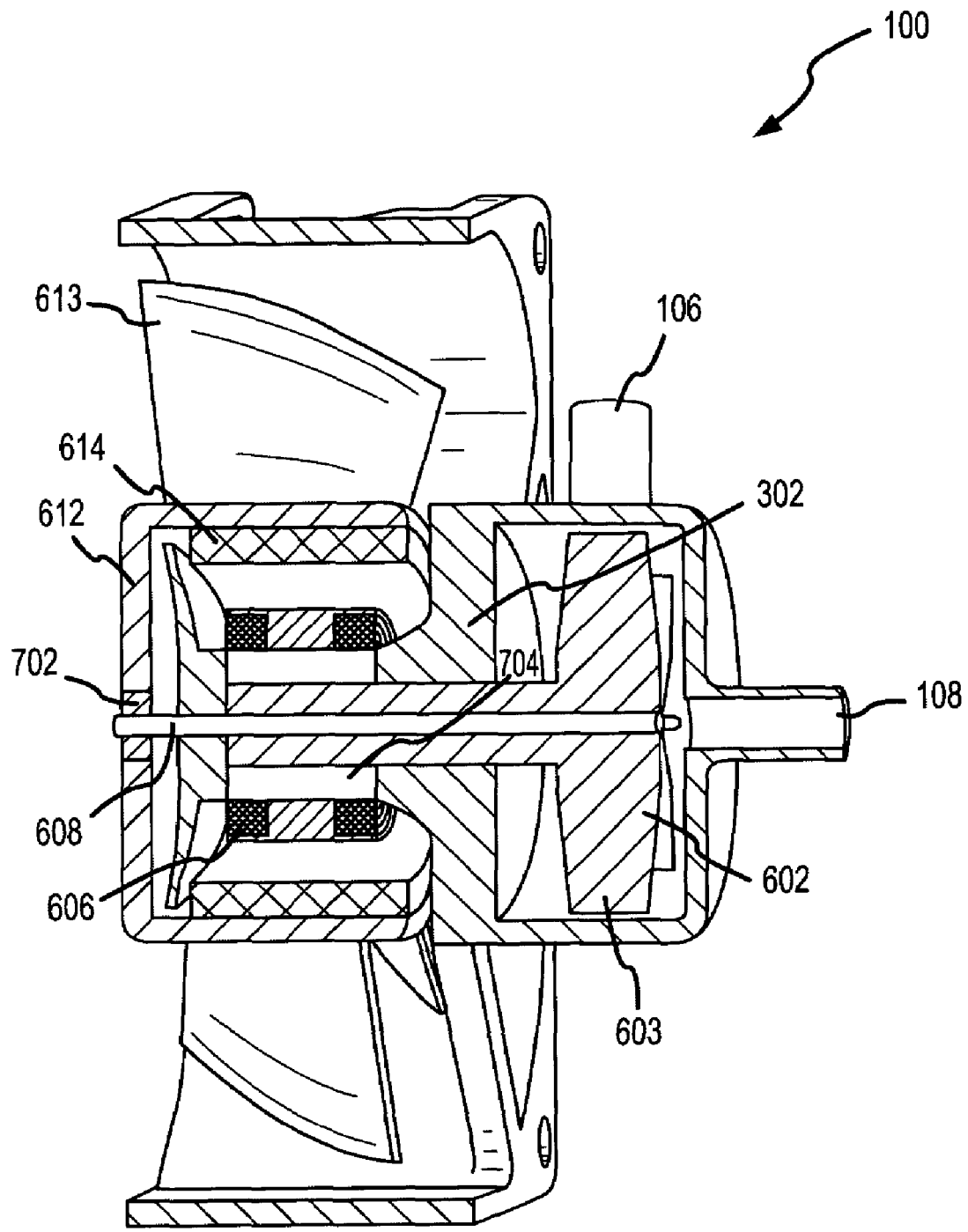
FIG. 7 is a cross-sectional view of an integrated fan pump in accordance with an alternate embodiment of the present invention.
Figure 8A:
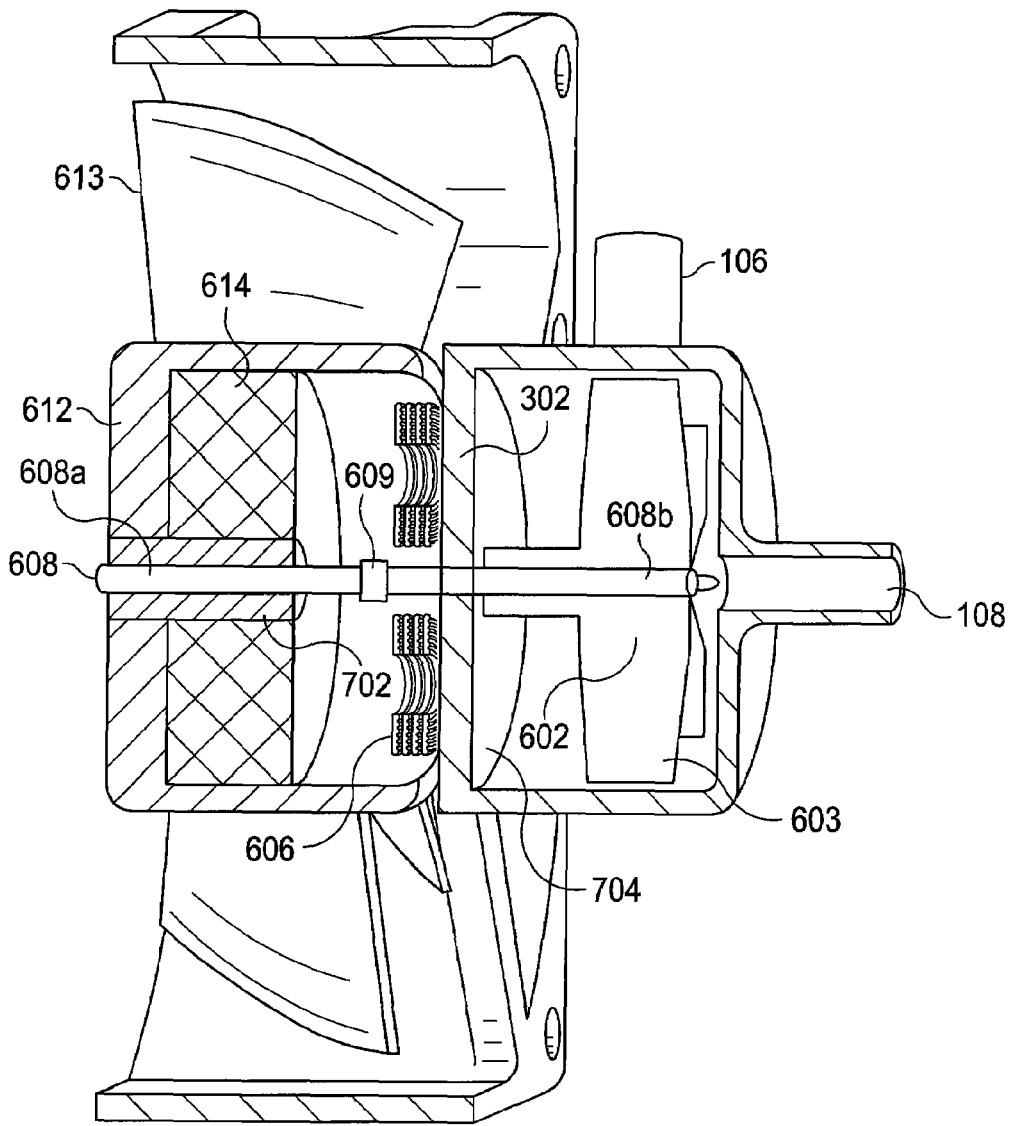
FIG. 8A is a cross-sectional view of an integrated fan pump in accordance with yet another embodiment of the present invention.

FIG. 8A shows an alternate embodiment of the module shown in FIG. 7. In this embodiment, magnetic coil 606 is situated between magnet 704 (which is coupled to pump head 602) and magnet 614 (which is coupled to fan head 614). Axle 608 (including segments 608a and 608b) is fixed to housing 302, thus, fan head 612 and pump 602 rotate freely around bearing 702. Magnets 704 and 614 are preferably disc-shaped, but may have any other convenient shape.

In an alternate embodiment of the present invention, a tip magnetic drive (TMD) mechanism is employed. That is, a magnetic coil is located at the outer perimeter of the fan within housing 302, while a magnetic ring is coupled to the outer perimeter of fan propeller 613 (i.e., adjacent to the magnetic coil).

Figure 8B:
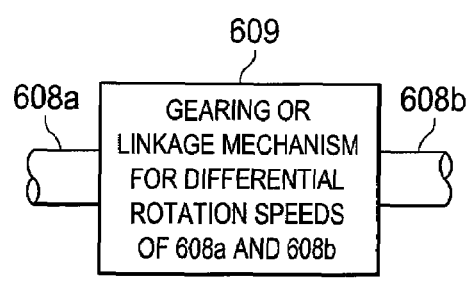
FIG. 8B is a magnified view of the gearing mechanism of FIG. 8A.

With respect to all the embodiments shown thus far, the axle has been illustrated as a single contiguous longitudinal member. In an alternate embodiment, however, the axle includes a first axle segment 608a coupled to the fan head and a second axle segment 608b coupled to the pump head, wherein the first and second axle segments are mechanically coupled via a gearing mechanism 609, e.g., one or more gears (as shown on FIGS. 6B and 8B), linkages, or other such mechanical couplings. The use of separate axles is advantageous in that the speed and power of the pump may be tailored for the strength of the motor.

Figure 9:
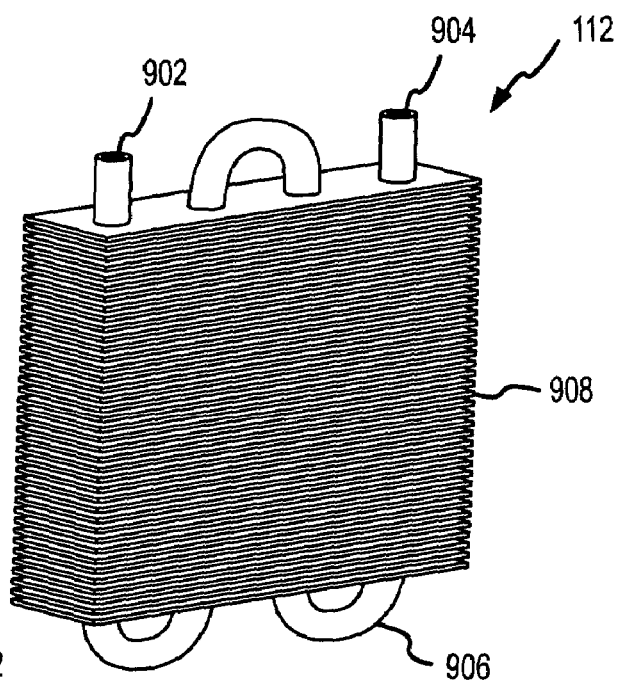
FIG. 9 is an exterior overview of an exemplary fin heat exchanger for use in conjunction with the present invention.
Figure 10:
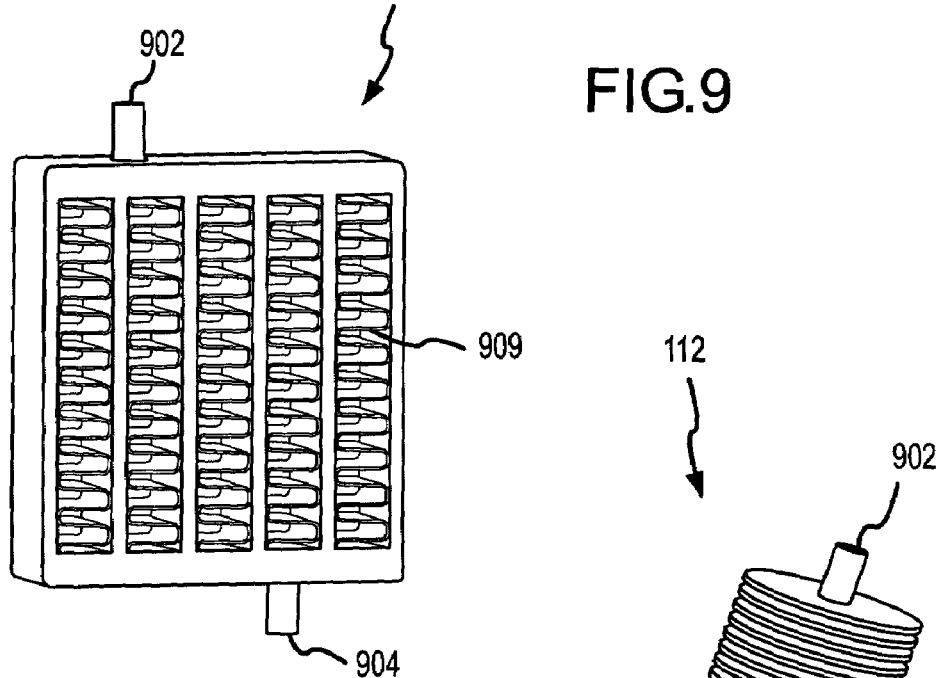
FIG. 10 is an exterior overview of an exemplary folded fin heat exchanger for use in conjunction with the present invention.
Figure 11:
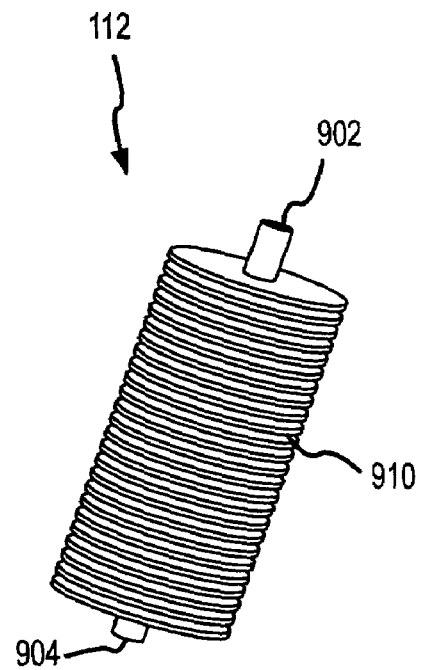
FIG. 11 is an exterior overview of a circular fin heat exchanger for use in conjunction with the present invention.

It will be appreciated that any form of heat exchanger may be used in conjunction with the present invention. FIGS. 9-11 show three such heat exchangers 112 having respective inlets 902 and outlets 904. More particularly, FIG. 9 shows a tube-through-fin embodiment comprising a plurality of thin parallel fins 908. FIG. 10 shows a folded fin heat exchanger comprising a plurality of folded fins 909, and FIG. 11 shows a heat exchanger characterized by a plurality of disc-shaped fins. These illustrations are not intended as limitations on the present invention. Indeed, any heat exchanger now known or developed in the future may be used in conjunction with the present invention.

Similarly, the coolant used by the pump and/or heat exchanger may be selected in accordance with a variety of design objectives. Typical coolant include water, alcohol, antifreeze, glycol, heat transfer fluid (e.g., Dowtherm) and other such liquids; however, any suitable coolant may be used.

In summary, what has been disclosed is a compact, efficient cooling apparatus including an electrical drive mechanism configured to drive both a fan and a pump. The illustrated embodiments, however, are not intended to limit the various structures and applications of the system. For example, while the present invention is often described in the context of the cooling of electronic components such as computer CPUs and the like, it will be appreciated that the systems disclosed herein may be used in any heat transfer application, for example, telecommunication and other electronic systems with a high heat load devices located in a densely packed space where forced air heat sink and heat pipe are not implementable or ineffective. These and other modifications in the selection, design, and arrangement of the various components and steps discussed herein may be made without departing from the scope of the invention as set forth in the appended claims.

What is claimed is:

1. An integrated fan pump comprising:
   a housing for supporting the integrated fan pump, wherein the housing has a rectilinear configuration;
   a fan coupled to the housing and having a fan head;
   a fan propeller coupled to the fan head, wherein the fan propeller is selected from the group consisting of axial, tubeaxial, centrifugal, crossflow, backward-curved, forward-curved, airfoil, turbine, and straight radial;
   a pump adapted to transfer a coolant from a coolant inlet to a coolant outlet, an external geometry of the pump adapted to be sufficiently compact such that gas flow through the fan and around the pump is substantially unimpeded by the pump, the gas flow moving from a gas flow inlet in a substantially straight, unchanged direction to a gas flow outlet, the pump having a pump head;
   a pump impeller coupled to the pump head, wherein the pump impeller is selected from the group consisting of axial propeller blade, straight radial blade, centrifugal blade, backward-curved blade, forward-curved blade, and turbine blade;
   an axle having a first axle segment coupled to the fan head and a second axle segment coupled to the pump head;
   a mechanical gear coupled to the first axle segment and the second axle segment, wherein the mechanical gear is configured to rotate the first axle segment at a different rate than the second axle segment;
   an expansion tank coupled to the pump;
   a gas-release valve coupled to the expansion tank;
   a liquid seal formed between the fan head and the pump head proximate to the axle, the liquid seal including a material selected from the group consisting of nitrile, polyacrylate, ethylene propylene, chloroprene, fluoro, silicone and butyl rubbers;
   a heat source connected to the coolant outlet of the pump;
   a heat exchanger coupled to the expansion tank, wherein the heat exchanger includes a plurality of disc-shaped fins and is coupled to the heat source, the heat exchanger using heat conduction and forced convection to transfer heat from the heat source to the coolant, and the heat exchanger is directly mounted to a surface of the fan; and
   an electrical drive mechanism, wherein the electrical drive mechanism is a DC brushless motor and includes:
      a first magnet coupled to the pump, the first magnet having a disc shape;
      a second magnet coupled to the fan, the second magnet having a disc shape, wherein the first magnet and the second magnet are substantially collinear; and
      a magnetic coil disposed between the first magnet and the second magnet, the magnetic coil having two solenoids, wherein the electrical drive mechanism is configured to simultaneously drive the fan and the pump, wherein the electrical drive mechanism has a rotational rate in the range of 2000 to 3000 rpm and the pump has a pump flow rate in the range of 5 cc/sec to 10 cc/sec and rotates the fan and the pump with respect to the housing.

2. The apparatus of claim 1, wherein the fan propeller is an axial propeller and a size of the fan is selected from the group consisting of 20×20 mm, 25×25 mm, 30×30 mm, 35×35 mm, 40×40 mm, 45×45 mm, 50×50 mm, 55×55 mm, 60×60 mm, 80×80 mm, 92×92 mm, 120×120 mm, 6" diagonal, 8" diagonal, 10" diagonal, and 12" diagonal.

3. The apparatus of claim 1, further including a low-friction sleeve bearing coupled to the axle.

4. The apparatus of claim 1, wherein the housing includes a material selected from the group consisting of polypropylene (PP), acrylonitrile butadiene styrene (ABS), polyethylene (PE), and polybutylene terephthalate (PBT).

5. The apparatus of claim 1, wherein the coolant includes a material selected from the group consisting of water, alcohol, antifreeze, and glycol.

* * * * *